United States Patent
Bathan et al.

(10) Patent No.: US 9,472,427 B2
(45) Date of Patent: Oct. 18, 2016

(54) SEMICONDUCTOR DEVICE AND METHOD OF FORMING LEADFRAME WITH NOTCHED FINGERS FOR STACKING SEMICONDUCTOR DIE

(75) Inventors: Henry D. Bathan, Singapore (SG); Zigmund R. Camacho, Singapore (SG); Jairus L. Pisigan, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 805 days.

(21) Appl. No.: 13/069,191

(22) Filed: Mar. 22, 2011

(65) Prior Publication Data
US 2012/0241915 A1 Sep. 27, 2012

(51) Int. Cl.
*H01L 21/98* (2006.01)
*H01L 21/56* (2006.01)
(Continued)

(52) U.S. Cl.
CPC ........... *H01L 21/568* (2013.01); *H01L 21/561* (2013.01); *H01L 23/49548* (2013.01); *H01L 23/49575* (2013.01); *H01L 24/73* (2013.01); *H01L 24/97* (2013.01); *H01L 23/3107* (2013.01); *H01L 23/481* (2013.01); *H01L 24/16* (2013.01); *H01L 24/48* (2013.01); *H01L 24/85* (2013.01); *H01L 2223/54426* (2013.01); *H01L 2224/0401* (2013.01); *H01L 2224/04042* (2013.01); *H01L 2224/0557* (2013.01); *H01L 2224/16145* (2013.01); *H01L 2224/16245* (2013.01); *H01L 2224/48091* (2013.01); *H01L 2224/48245* (2013.01); *H01L 2224/48247* (2013.01); *H01L 2224/73257* (2013.01); *H01L 2224/85005* (2013.01); *H01L 2224/97* (2013.01);
(Continued)

(58) Field of Classification Search
USPC .......... 257/621, E21.499, E21.705, E23.033; 438/108, 112
See application file for complete search history.

(56) References Cited

U.S. PATENT DOCUMENTS 3,750,277 A * 8/1973 Happ ................... H01L 21/4821
29/827
4,857,801 A * 8/1989 Farrell .......................... 313/500
(Continued)

FOREIGN PATENT DOCUMENTS

JP 11340386 A * 12/1999 ............. H01L 23/40

OTHER PUBLICATIONS

English Abstract of JP 11340386.*
(Continued)

*Primary Examiner* — Hrayr A Sayadian
(74) *Attorney, Agent, or Firm* — Robert D. Atkins; Patent Law Group: Atkins and Associates, P.C.

(57) ABSTRACT

A semiconductor device has a leadframe with first and second opposing surfaces and a plurality of notched fingers. The leadframe is mounted to a carrier. A first semiconductor die is mounted over the carrier between the notched fingers. Conductive TSVs are formed through the first semiconductor die. A bond wire is formed between a first contact pad on the first semiconductor die and notched finger. The conductive TSV are electrically connected to the bond wires. An encapsulant is deposited over the first semiconductor die and notched fingers. Bumps are formed over the first surface of the leadframe. The carrier is removed and the leadframe is singulated. The leadframe and first semiconductor die is mounted to a substrate. A second semiconductor die is mounted to a second contact pad on the first semiconductor die. A third semiconductor die is mounted to the second surface of the leadframe.

24 Claims, 8 Drawing Sheets

(51) Int. Cl.
*H01L 23/495* (2006.01)
*H01L 23/00* (2006.01)
*H01L 23/31* (2006.01)
*H01L 23/48* (2006.01)

(52) U.S. Cl.
CPC ............ H01L 2225/0651 (2013.01); H01L 2225/06513 (2013.01); H01L 2225/06541 (2013.01); H01L 2225/06565 (2013.01); H01L 2225/06568 (2013.01); H01L 2924/00013 (2013.01); H01L 2924/00014 (2013.01); H01L 2924/0103 (2013.01); H01L 2924/014 (2013.01); H01L 2924/01013 (2013.01); H01L 2924/01024 (2013.01); H01L 2924/01029 (2013.01); H01L 2924/01047 (2013.01); H01L 2924/01049 (2013.01); H01L 2924/01074 (2013.01); H01L 2924/01078 (2013.01); H01L 2924/01079 (2013.01); H01L 2924/01082 (2013.01); H01L 2924/01322 (2013.01); H01L 2924/12041 (2013.01); H01L 2924/12042 (2013.01); H01L 2924/1306 (2013.01); H01L 2924/13091 (2013.01); H01L 2924/15311 (2013.01); H01L 2924/15321 (2013.01); H01L 2924/181 (2013.01); H01L 2924/18165 (2013.01)

(56) References Cited

U.S. PATENT DOCUMENTS

| | | | |
|---|---|---|---|
| 7,384,819 B2 | 6/2008 | Yip et al. | |
| 2002/0027273 A1* | 3/2002 | Huang | 257/678 |
| 2005/0006743 A1* | 1/2005 | Kim et al. | 257/685 |
| 2007/0085189 A1* | 4/2007 | Sunohara et al. | 257/686 |
| 2007/0111374 A1 | 5/2007 | Islam et al. | |
| 2007/0254409 A1* | 11/2007 | Yip et al. | 438/126 |
| 2008/0150106 A1* | 6/2008 | Pang Kuah et al. | 257/676 |
| 2008/0283994 A1* | 11/2008 | Tsai et al. | 257/686 |
| 2009/0152700 A1 | 6/2009 | Kuan et al. | |
| 2009/0267194 A1* | 10/2009 | Chen | 257/621 |
| 2010/0065948 A1 | 3/2010 | Bae et al. | |
| 2010/0078789 A1 | 4/2010 | Choi et al. | |
| 2011/0031947 A1* | 2/2011 | You | H01L 23/49548 323/282 |

OTHER PUBLICATIONS

Merriam-Webster OnLine definition of notch. No date.*

Merriam-Webster OnLine definition of over. No date.*

* cited by examiner

SEMICONDUCTOR DEVICE AND METHOD OF FORMING LEADFRAME WITH NOTCHED FINGERS FOR STACKING SEMICONDUCTOR DIE

FIELD OF THE INVENTION

The present invention relates in general to semiconductor devices and, more particularly, to a semiconductor device and method of forming a leadframe with notched fingers for stacking semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a fan-out wafer level chip scale package (Fo-WLCSP), a semiconductor die is typically enclosed by an encapsulant. A top and bottom build-up interconnect structure is formed over opposite surfaces of the encapsulant for electrical interconnect, e.g., when stacking the Fo-WLCSPs. Each build-up interconnect structure requires formation of a redistribution layer (RDL) involving complex, expensive, and time-consuming manufacturing steps, such as lithography, etching, and metal deposition. One or more semiconductor die can be stacked over the Fo-WLCSP with a die attach adhesive and electrically connected to the top and bottom build-up interconnect structure. These package integration techniques add complexity and manufacturing costs.

SUMMARY OF THE INVENTION

A need exists for a simple and cost effective electrical interconnect for stackable Fo-WLCSPs. Accordingly, in one embodiment, the present invention is a method of making a semiconductor device comprising the steps of providing a leadframe having first and second opposing surfaces and a plurality of notched fingers, mounting the leadframe to a carrier, mounting a first semiconductor die over the carrier between the notched fingers, forming a bond wire between a first contact pad on the first semiconductor die and notched finger, depositing an encapsulant over the first semiconductor die and notched fingers, removing the carrier, singulating the leadframe, and forming a plurality of bumps over the first surface of the leadframe.

In another embodiment, the present invention is a method of making a semiconductor device comprising the steps of providing a leadframe having first and second opposing surfaces and a plurality of notched fingers, mounting a first semiconductor die between the notched fingers, forming a bond wire between a first contact pad on the first semiconductor die and notched finger, depositing an encapsulant over the first semiconductor die and notched fingers, and forming a plurality of bumps over the first surface of the leadframe.

In another embodiment, the present invention is a method of making a semiconductor device comprising the steps of providing a leadframe having a plurality of notched fingers, mounting a first semiconductor die between the notched fingers, forming a bond wire between a first contact pad on the first semiconductor die and notched finger, and depositing an encapsulant over the first semiconductor die and notched fingers.

In another embodiment, the present invention is a semiconductor device comprising a leadframe having first and second opposing surfaces and a plurality of notched fingers. A semiconductor die is mounted between the notched fingers. A bond wire is formed between a first contact pad on the first semiconductor die and notched finger. An encapsulant is deposited over the first semiconductor die and notched fingers. A plurality of bumps is formed over the first surface of the leadframe.

DETAILED DESCRIPTION OF THE DRAWINGS

Figure 1:
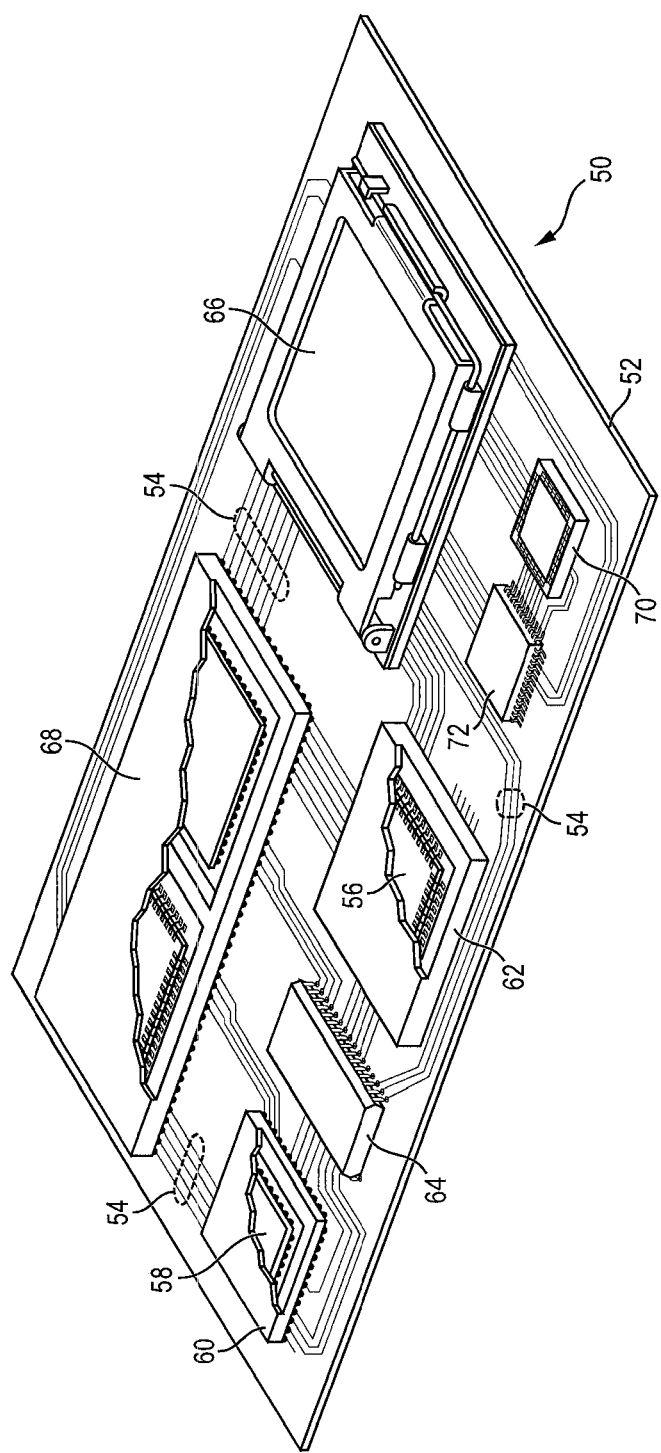
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
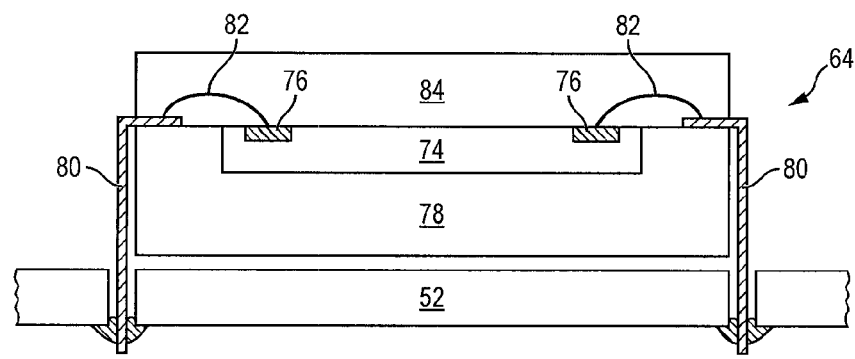
FIGS. 2a-2c illustrate further detail of the representative semiconductor packages mounted to the PCB.
Figure 2B:
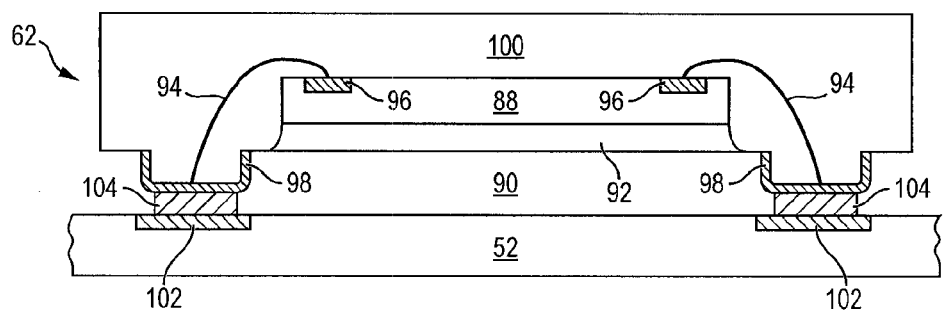
Figure 2C:
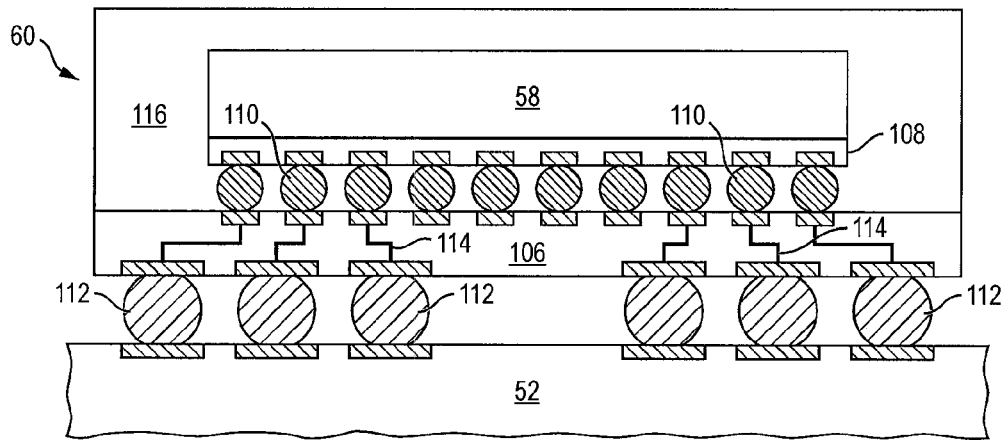

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
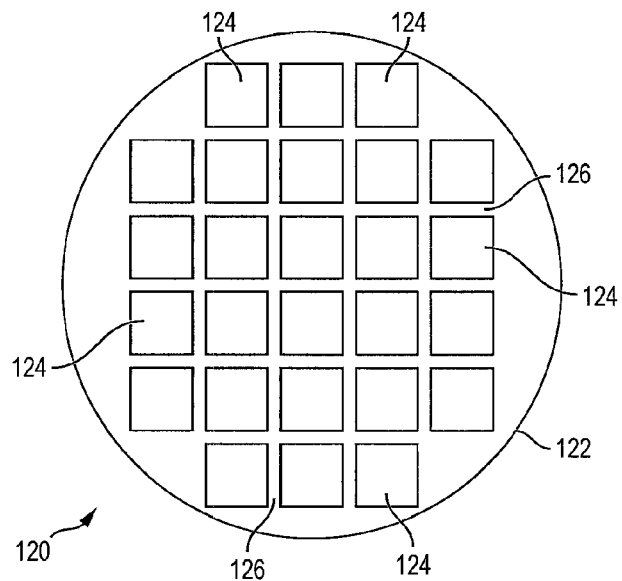
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124. In one embodiment, semiconductor die 124 may have dimensions ranging from 2×2 millimeters (mm) to 15×15 mm.

Figure 3B:
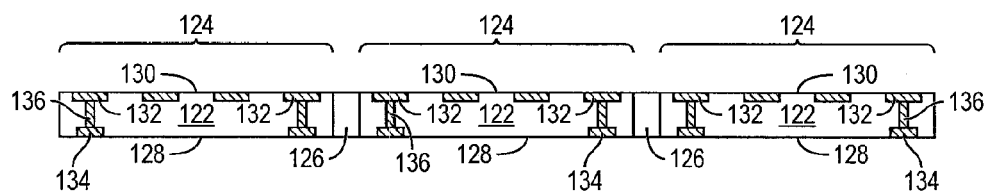

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. Semiconductor die 124 can be a flipchip type die, bond wire die, or combination thereof.

An electrically conductive layer 132 is formed over active surface 130 using PVD, CVD, electrolytic plating, electroless plating process, or other suitable metal deposition process. Likewise, an electrically conductive layer 134 is formed over back surface 128. Conductive layers 132 and 134 can be one or more layers of Al, Cu, Sn, Ni, Au, Ag, or other suitable electrically conductive material. Conductive layer 132 operates as contact pads electrically connected to the circuits on active surface 130. Conductive layer 134 operates as contact pads on back surface 128. Contact pads 132 and 134 can be disposed side-by-side a first distance from the edge of semiconductor die 124, as shown in FIG. 3b. Alternatively, contact pads 132 and 134 can be offset in multiple rows such that a first row of contact pads is disposed a first distance from the edge of the die, and a second row of contact pads alternating with the first row is disposed a second distance from the edge of the die.

A plurality of vias is formed through semiconductor wafer 120 using mechanical drilling, laser drilling, or deep reactive ion etching (DRIE). The vias are filled with Al, Cu, Sn, Ni, Au, Ag, Ti, tungsten (W), poly-silicon, or other suitable electrically conductive material using electrolytic plating, electroless plating process, or other suitable metal deposition process to form z-direction conductive through silicon vias (TSV) 136 electrically connected to contact pads 134 on back surface 128.

Figure 3C:
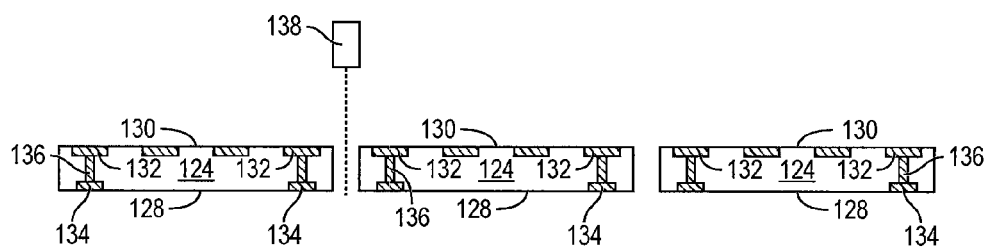

In FIG. 3c, semiconductor wafer 120 is singulated through saw street 126 using a saw blade or laser cutting tool 138 into individual semiconductor die 124.

Figure 4A:
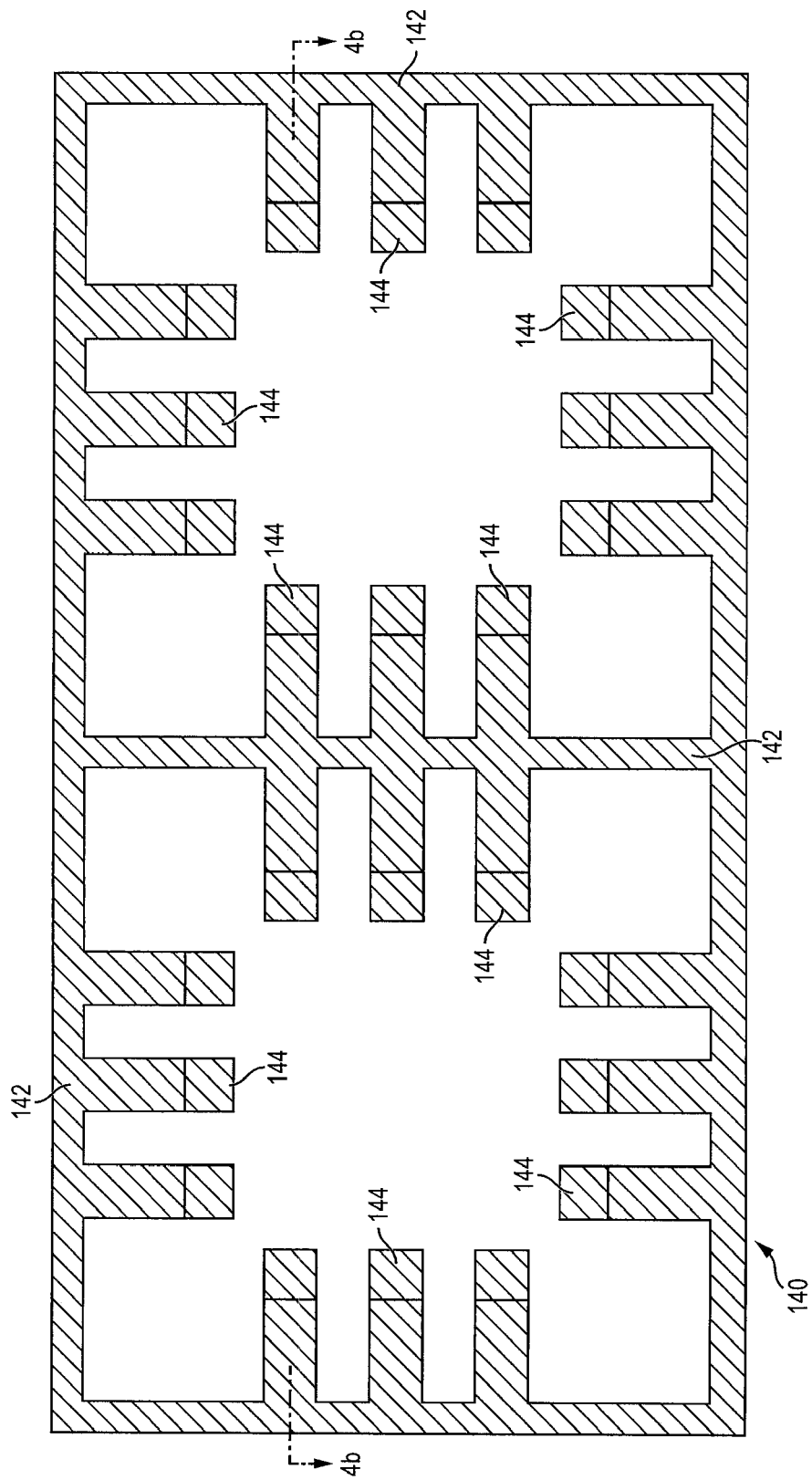
FIGS. 4a-4g illustrate a process of forming a leadframe with notched fingers for stacking semiconductor die.

FIGS. 4a-4g illustrate, in relation to FIGS. 1 and 2a-2c, a process of forming a leadframe having notched fingers for stacking semiconductor die. FIG. 4a shows a top view of a multi-die metal leadframe 140 adapted for receiving semiconductor die. The semiconductor die are attached to leadframe 140 for structural support and electrical interconnection. In one embodiment, leadframe 140 is an un-singulated flat pre-molded or prefabricated laminated substrate. Leadframe 140 includes a dambar structure 142 around a perimeter of each die mounting site with a plurality of integrated fingers or contact pads 144 extending from all sides of the dambar structure. Leadframe 140 is made with gold, silver, nickel, platinum, copper, copper alloys (including one or more elements of nickel, iron, zinc, tin, chromium, silver, and phosphorous), or other suitable materials. The dambar structure 142 is removed in a subsequent manufacturing step.

Figure 4B:
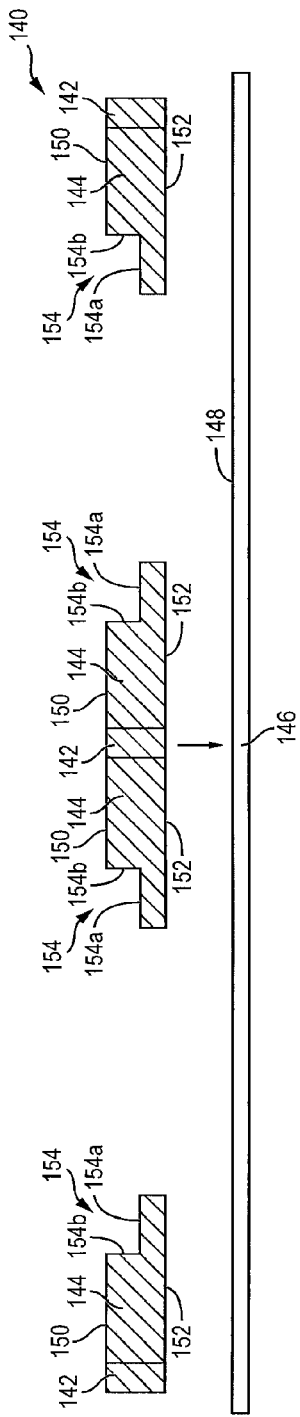

FIG. 4b shows a substrate or carrier 146 containing temporary or sacrificial base material such as silicon, polymer, beryllium oxide, or other suitable low-cost, rigid material for structural support. In one embodiment, substrate 146 is a backing or support tape with temporary adhesive bonding surface 148. The integrated leadframe 140 has a first surface 150 and opposing second surface 152. Leadframe fingers 144 are formed with a notch 154 having horizontal surface 154a and vertical surface 154b. In one embodiment, the height of integrated leadframe fingers 144 between surface 150 and opposing surface 152 is in the range of approximately 100-255 micrometers (μm). The height of integrated leadframe fingers 144 between horizontal surface 154a and surface 152 is approximately 30-85 μm or one third the height of the integrated leadframe fingers between surface 150 and opposing surface 152. Leadframe 140 can be stamped or etched to form notched fingers 144.

Figure 4C:
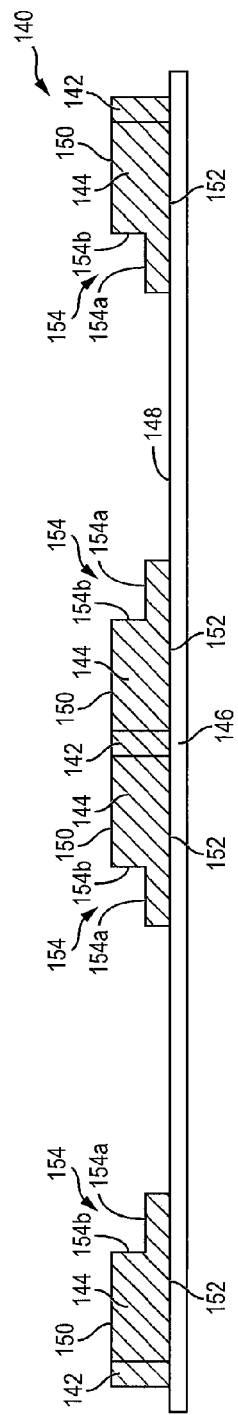

In FIG. 4c, leadframe 140 is positioned over and mounted to carrier 146. Leadframe 140 remains temporarily fixed to adhesive bonding surface 148.

Figure 4D:
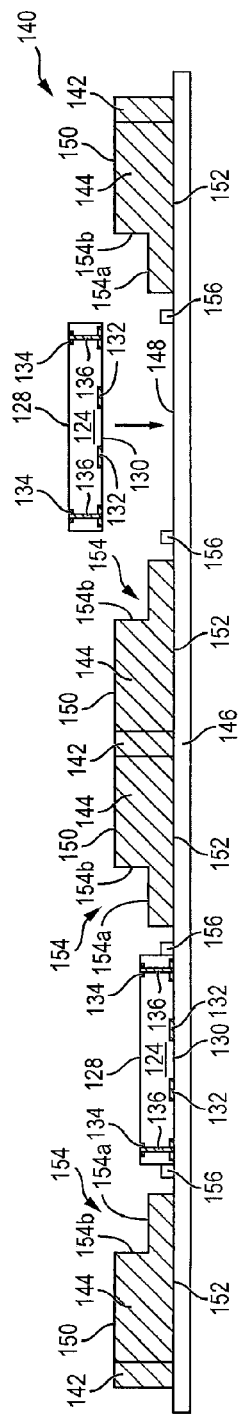
Figure 4E:
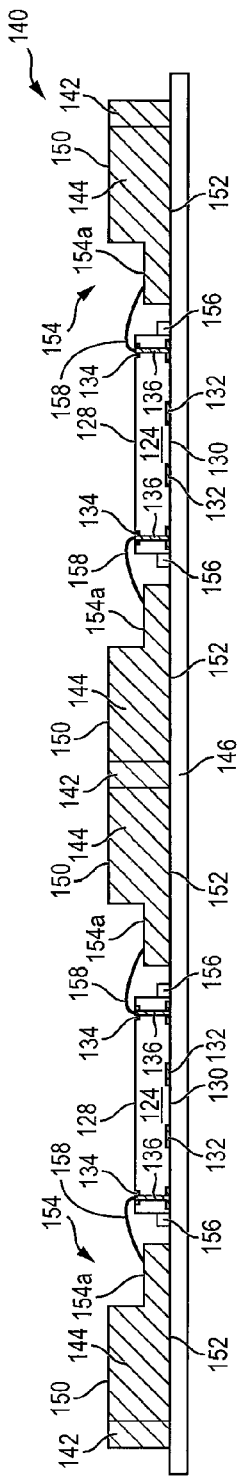

In FIG. 4d, semiconductor die 124 from FIGS. 3a-3c are positioned over and mounted to adhesive bonding surface 148 using a pick and place operation with active surface 130 oriented toward carrier 146. Fiducial alignment marks 156 can be formed on carrier 146 to assist with die alignment, e.g., around each die mounting site. FIG. 4e shows semiconductor die 124 mounted to carrier 146. Semiconductor die 124 remain temporarily fixed to adhesive bonding surface 148. Bond wires 158 are formed between contact pads 134 and horizontal surface 154a of integrated leadframe fingers 144. Bond wires 158 electrically connect contact pads 134 and conductive TSVs 136 to horizontal surface 154a of integrated leadframe fingers 144.

Figure 4F:
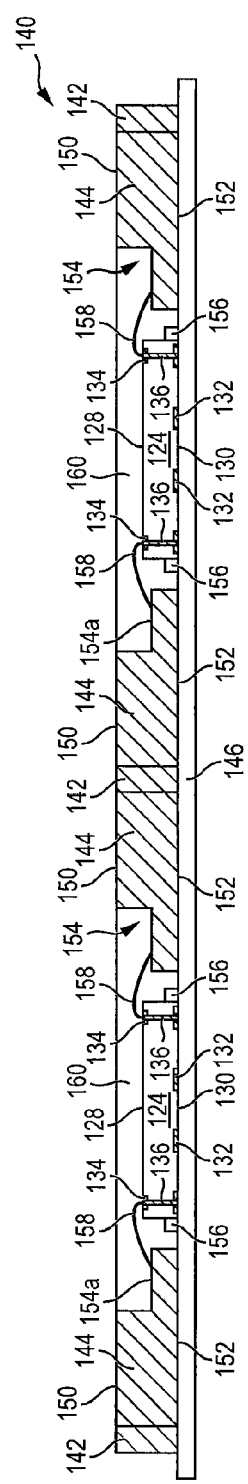

In FIG. 4f, an encapsulant or molding compound 160 is deposited over semiconductor die 124, bond wires 158, and notch surfaces 154a-154b of integrated leadframe fingers 144 using a paste printing, compressive molding, transfer molding, liquid encapsulant molding, vacuum lamination, spin coating, or other suitable applicator. Encapsulant 160 can be polymer composite material, such as epoxy resin with filler, epoxy acrylate with filler, or polymer with proper filler. The viscosity of encapsulant 160 is selected for uniform coverage, e.g., a lower viscosity increases the flow of the encapsulant. Leadframe 140 and encapsulant 160 can be planarized to remove excess encapsulant from surface 150 of integrated leadframe fingers 144. Encapsulant 160 is non-conductive and environmentally protects the semiconductor device from external elements and contaminants.

Figure 4G:
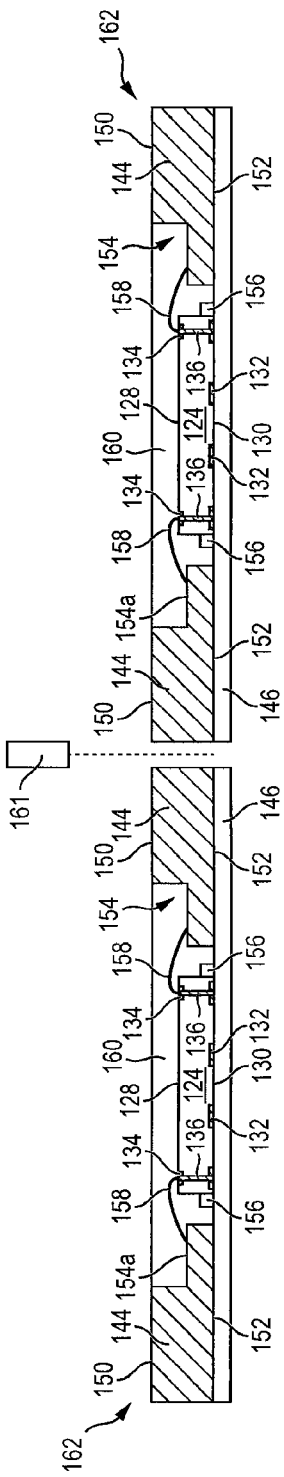

In FIG. 4g, leadframe 140 is singulated through dambar 142 with saw blade or laser cutting tool 161 into individual Fo-WLCSPs 162 each with semiconductor die 124 embedded within encapsulant 160 and electrically connected to leadframe fingers 144 using bond wires 158. Carrier 146 is removed by chemical etching, mechanical peeling, CMP, mechanical grinding, thermal bake, UV light, laser scanning, or wet stripping to expose contact pads 132 and surface 152 of leadframe fingers 144.

Figure 5A:
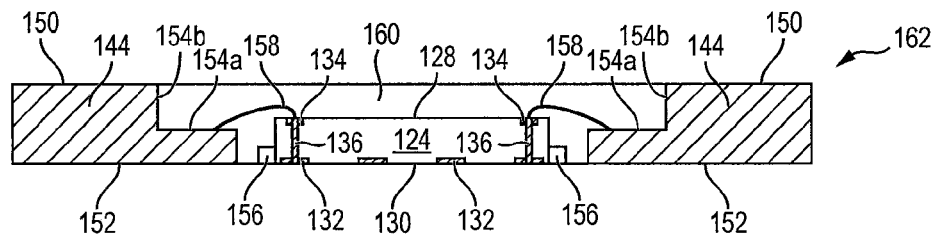
FIGS. 5a-5c illustrate the notched leadframe fingers with embedded semiconductor die and bumps formed over the leadframe fingers.

FIG. 5a shows Fo-WLCSP 162 after singulation with semiconductor die 124 embedded within encapsulant 160 and electrically connected to leadframe fingers 144. Semiconductor die 124 is electrically connected to leadframe fingers 144 through bond wires 158.

Figure 5B:
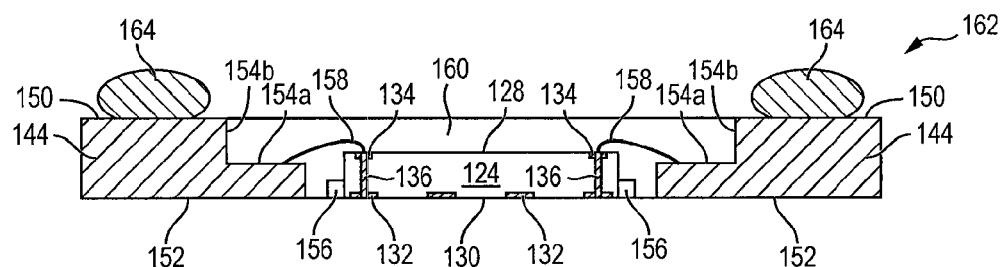

In FIG. 5b, an electrically conductive bump material is deposited over surface 150 of leadframe fingers 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to leadframe fingers 144 using a suitable attachment or bonding process. In one embodiment, the bump material is reflowed by heating the material above its melting point to form spherical balls or bumps 164. In some applications, bumps 164 are reflowed a second time to improve electrical contact to leadframe fingers 144. An under bump metallization (UBM) layer can be formed under bumps 164. The bumps can also be compression bonded to leadframe fingers 144. Bumps 164 represent one type of interconnect structure that can be formed over leadframe fingers 144. The interconnect structure can also use stud bump, micro bump, or other electrical interconnect. Bumps 164 can be formed prior to leadframe singulation, see FIG. 4f.

Figure 5C:
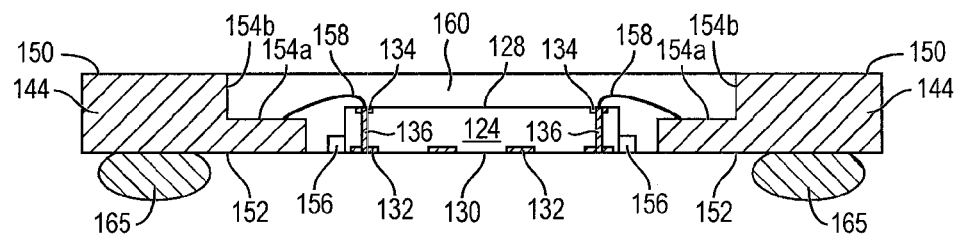

In another embodiment, FIG. 5c shows an electrically conductive bump material deposited over surface 152 of leadframe fingers 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to leadframe fingers 144 using a suitable attachment or bonding process. In one embodiment, the bump material is reflowed by heating the material above its melting point to form spherical balls or bumps 165. In some applications, bumps 165 are reflowed a second time to improve electrical contact to leadframe fingers 144. A UBM layer can be formed under bumps 165. The bumps can also be compression bonded to leadframe fingers 144. Bumps 165 represent one type of interconnect structure that can be formed over leadframe fingers 144. The interconnect structure can also use stud bump, micro bump, or other electrical interconnect. Bumps 165 can be formed prior to leadframe singulation, see FIG. 4f.

Figure 6:
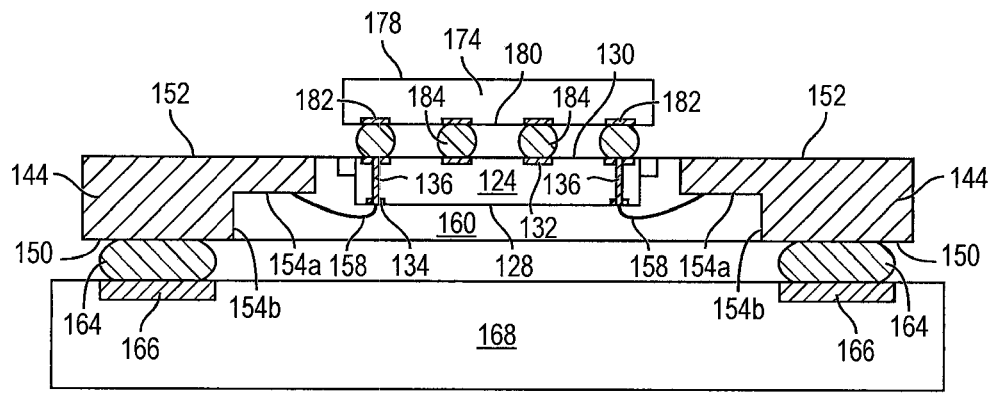
FIG. 6 illustrates the notched leadframe with two stacked semiconductor die.

FIG. 6 shows an embodiment with semiconductor die 124 and leadframe fingers 144 mounted to contact pads 166 of PCB 168 using bumps 164. Semiconductor die 174 has a back surface 178 and active surface 180 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 180 to implement analog circuits or digital circuits, such as DSP, ASIC, memory, or other signal processing circuit. Semiconductor die 174 may also contain IPDs, such as inductors, capacitors, and resistors, for RF signal processing. In one embodiment, semiconductor die 174 can be a flipchip type die. Bumps 184 are formed over contact pads 182 of active surface 180. Semiconductor die 174 is mounted to contact pads 132 of semiconductor die 124 using bumps 184.

Figure 7:
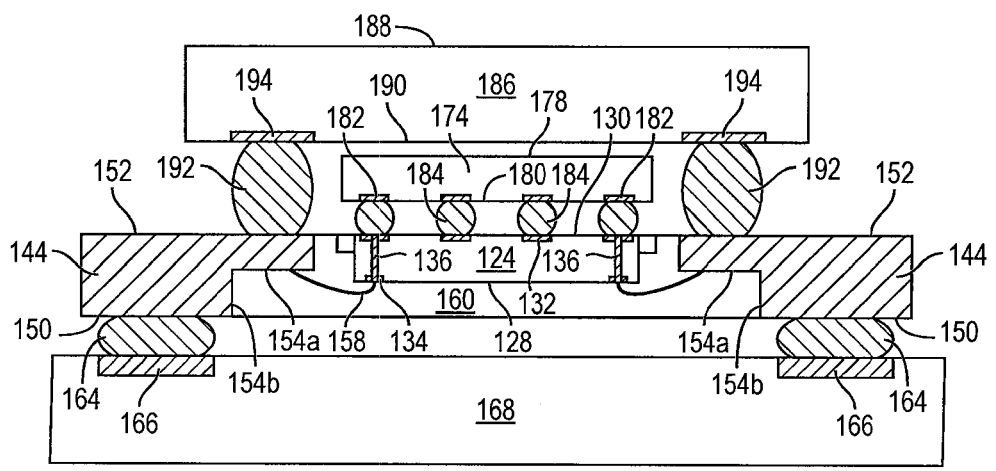
FIG. 7 illustrates the notched leadframe with three stacked semiconductor die.

FIG. 7 shows another embodiment, similar to FIG. 6, with semiconductor die 186 having a back surface 188 and active surface 190 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 190 to implement analog circuits or digital circuits, such as DSP, ASIC, memory, or other signal processing circuit. Semiconductor die 186 may also contain IPDs, such as inductors, capacitors, and resistors, for RF signal processing. In one embodiment, semiconductor die 186 can be a flipchip type die. Bumps 192 are formed over contact pads 194 of active surface 190. Semiconductor die 186 is mounted to surface 152 of leadframe fingers 144 using bumps 192.

Leadframe fingers 144 with notch 154 provide an efficient and cost effective fan-in and fan-out routing structure for integration of stacked known good semiconductor die 124, 174, and 186 without die attach adhesive. Semiconductor die 124 and 174 can be the same size die or different size die.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a leadframe including a first surface and a second surface opposite the first surface of the leadframe, the leadframe including a first finger and a second finger with a die mounting site disposed between the first finger and second finger, wherein a first portion of the first finger and a second portion of the second finger extend between the first surface and second surface of the leadframe and a first notched portion of the first finger extends from the first portion of the first finger along the second surface of the leadframe and a second notched portion of the second finger extends from the second portion of the first finger along the second surface of the leadframe, wherein the first notched portion of the first finger and the second notched portion of the second finger each have a height less than a height between the first surface and second surface of the leadframe;
    disposing a first semiconductor die over the die mounting site between the first finger and the second finger;
    forming a bond wire between a contact pad on the first semiconductor die and the first notched portion of the first finger;
    depositing an encapsulant over the first semiconductor die and bond wire and further over the first notched portion of the first finger and the second notched portion of the second finger, wherein a surface of the encapsulant is coplanar with the first surface of the leadframe; and
    forming a bump over the first surface or second surface over the first portion of the first finger after depositing the encapsulant.

2. The method of claim 1, further including forming a conductive via through the first semiconductor die and electrically connected to the bond wire.

3. The method of claim 1, further including:
    providing a second semiconductor die; and
    disposing the second semiconductor die over the first semiconductor die.

4. The method of claim 1, further including:
    providing a second semiconductor die; and
    disposing the second semiconductor die over the leadframe.

5. The method of claim 1, further including:
    providing a substrate; and
    disposing the leadframe and first semiconductor die over the substrate.

6. A method of making a semiconductor device, comprising:
    providing a leadframe including a first surface and a second surface opposite the first surface of the leadframe, wherein a first portion of a finger of the leadframe extends between the first surface and second surface of the leadframe and a notched portion of the finger extends from the first portion of the finger along the second surface of the leadframe, wherein the notched portion of the finger has a height less than a height between the first surface and second surface of the leadframe;
    disposing a first semiconductor die within the leadframe adjacent to the finger;
    forming a bond wire between a contact pad on the first semiconductor die and the notched portion of the finger;

depositing an encapsulant over the first semiconductor die and bond wire and further over the notched portion of the finger; and forming a bump over the first surface or second surface over the first portion of the finger.

7. The method of claim 6, further including forming a conductive via through the first semiconductor die and electrically connected to the bond wire.

8. The method of claim 6, wherein a surface of the encapsulant is coplanar with the first surface of the leadframe.

9. The method of claim 6, further including:
providing a second semiconductor die; and
disposing the second semiconductor die over the first semiconductor die.

10. The method of claim 6, further including:
providing a second semiconductor die; and
disposing the second semiconductor die over the leadframe.

11. The method of claim 6, further including:
providing a substrate; and
disposing the leadframe and first semiconductor die over the substrate.

12. A method of making a semiconductor device, comprising:
providing a leadframe including a first surface and a second surface opposite the first surface of the leadframe, wherein a first portion of a finger of the leadframe extends between the first surface and second surface of the leadframe and a notched portion of the finger extends from the first portion of the finger along the second surface of the leadframe, wherein the notched portion of the finger has a height less than a height between the first surface and second surface of the leadframe;
disposing a first semiconductor die over a die mounting site interior to the leadframe;
forming a bond wire between the first semiconductor die and the notched portion of the finger; and
depositing an encapsulant over the first semiconductor die and bond wire and further over the notched portion of the finger.

13. The method of claim 12, further including forming a bump over the first surface or second surface over the first portion of the finger.

14. The method of claim 12, further including:
providing a substrate; and
disposing the leadframe and first semiconductor die over the substrate.

15. The method of claim 12, further including:
providing a second semiconductor die; and
disposing the second semiconductor die over the first semiconductor die.

16. The method of claim 12, further including:
providing a second semiconductor die; and
disposing the second semiconductor die over the leadframe.

17. The method of claim 1, further including disposing a second semiconductor die over the first semiconductor die and electrically connected to the bump.

18. The method of claim 6, further including disposing a second semiconductor die over the first semiconductor die and electrically connected to the bump.

19. The method of claim 15, further including disposing a third semiconductor die over the first semiconductor die and second semiconductor die and electrically connected to the leadframe.

20. A method of making a semiconductor device, comprising:
providing a leadframe including a first notched finger and a second notched finger, wherein a height of the first notched finger and second notched finger is less than a height of the leadframe;
disposing a first semiconductor die between the first notched finger and the second notched finger;
forming a bond wire between the first semiconductor die and the first notched finger; and
depositing an encapsulant over the first semiconductor die and bond wire and further over the first notched finger and second notched finger.

21. The method of claim 20, wherein a surface of the encapsulant is coplanar with a surface of the leadframe.

22. The method of claim 20, further including forming an interconnect structure over a surface of the leadframe.

23. The method of claim 22, wherein forming the interconnect structure includes forming a bump.

24. The method of claim 20, further including disposing a second semiconductor die over the first semiconductor die.

* * * * *